United States Patent
Iwamoto

(10) Patent No.: US 10,431,520 B2
(45) Date of Patent: Oct. 1, 2019

(54) SEMICONDUCTOR DEVICE AND MANUFACTURING METHOD OF SEMICONDUCTOR DEVICE

(71) Applicant: FUJI ELECTRIC CO., LTD., Kanagawa (JP)

(72) Inventor: Susumu Iwamoto, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/885,830

(22) Filed: Feb. 1, 2018

(65) Prior Publication Data
US 2018/0286779 A1  Oct. 4, 2018

(30) Foreign Application Priority Data
Mar. 31, 2017 (JP) .................. 2017-071556

(51) Int. Cl.
| | |
|---|---|
| H01L 23/42 | (2006.01) |
| H01L 23/367 | (2006.01) |
| H01L 23/043 | (2006.01) |
| H01L 21/52 | (2006.01) |
| H01L 23/373 | (2006.01) |
| H01L 23/40 | (2006.01) |
| H01L 23/538 | (2006.01) |
| H01L 23/31 | (2006.01) |
| H01L 21/56 | (2006.01) |
| H01L 25/065 | (2006.01) |

(52) U.S. Cl.
CPC .......... *H01L 23/3675* (2013.01); *H01L 21/52* (2013.01); *H01L 21/565* (2013.01); *H01L 23/043* (2013.01); *H01L 23/3121* (2013.01); *H01L 23/3735* (2013.01); *H01L 23/4006* (2013.01); *H01L 23/42* (2013.01); *H01L 23/5385* (2013.01); *H01L 25/0655* (2013.01)

(58) Field of Classification Search
CPC .. H01L 23/4006; H01L 23/42; H01L 23/5384
See application file for complete search history.

(56) References Cited

U.S. PATENT DOCUMENTS

| | | | |
|---|---|---|---|
| 9,385,061 B2* | 7/2016 | Nakamura | ............ H01L 25/072 |
| 2008/0284007 A1 | 11/2008 | Horio et al. | |
| 2014/0346659 A1 | 11/2014 | Nakamura et al. | |

FOREIGN PATENT DOCUMENTS

| | | |
|---|---|---|
| JP | H10-12813 A | 1/1998 |
| JP | 2008-288414 A | 11/2008 |
| JP | 2013-191806 A | 9/2013 |
| JP | 2014-179376 A | 9/2014 |
| WO | 2013/145619 A1 | 10/2013 |

* cited by examiner

*Primary Examiner* — Mark V Prenty

(57) ABSTRACT

A space having a certain thickness is provided between a metal base and a heat-dissipation fin set or the like. A semiconductor device is provided, including: a package portion; a metal base which is housed in the package portion and is exposed at a lower surface of the package portion; a semiconductor chip which is housed in the package portion and is placed above the metal base; and a frame portion provided to surround a penetration space penetrating the package portion, wherein a lower end of the frame portion protrudes below the lower surface of the package portion and a lower surface of the metal base. It is preferable that the frame portion is inserted in the penetration space after the penetration space is formed in the package portion.

11 Claims, 13 Drawing Sheets

B-B

SEMICONDUCTOR DEVICE AND MANUFACTURING METHOD OF SEMICONDUCTOR DEVICE

The contents of the following Japanese patent application are incorporated herein by reference:
NO. 2017-071556 filed on Mar. 31, 2017.

BACKGROUND

1. Technical Field

The present invention relates to a semiconductor device and a manufacturing method of a semiconductor device.

2. Related Art

Conventionally, semiconductor devices having a resin casing housing semiconductor chips are known (see Patent Documents 1 and 2, for example). The semiconductor chip is directly or indirectly supported with a metal base such as a copper plate. The metal base is exposed at the lower surface of the resin casing and contacts a heat-dissipation fin set or the like.

Patent Document 1: Japanese Patent Application Publication No. 2014-179376
Patent Document 2: Japanese Patent Application Publication No. Hei. 10-12813

It is preferable that, between the metal base and the heat-dissipation fin set or the like, there is a space having a predetermined thickness for providing thermal grease or the like to improve the thermal conduction property.

SUMMARY

A first aspect of the present invention provides a semiconductor device including a package portion. The semiconductor device may include a metal base housed in the package portion. The metal base may be exposed at a lower surface of the package portion. The semiconductor device may include a semiconductor chip housed in the package portion. The semiconductor chip may be placed above the metal base. The semiconductor device may include a frame portion provided to surround a penetration space penetrating the package portion. A lower end of the frame portion may protrude below the lower surface of the package portion and a lower surface of the metal base.

The frame portion may have a wider portion outside the package portion, the wider portion having a greater width than a portion inserted in the penetration space of the package portion. The wider portion may be provided above an upper surface of the package portion. The wider portion may be provided to contact the lower surface of the package portion.

The semiconductor device may further include a heat-dissipation portion provided below the lower surface of the metal base. The lower end of the frame portion may contact the heat-dissipation portion. The semiconductor device may further include thermal grease provided on the lower surface of the metal base.

An upper end of the frame portion may protrude above an upper surface of the package portion. A length by which the lower end of the frame portion protrudes below the lower surface of the metal base may be 50 µm or more and 100 µm or less.

The penetration space may be an open space provided extending from an end side of the package portion toward an inside of the package portion in a plane parallel to an upper surface of the package portion. The penetration space may have a curved shape at a tip portion farthest from the end side of the package portion in the plane parallel to the upper surface of the package portion.

The frame portion may have springiness. When the frame portion is inserted along an inner wall of the penetration space, a restoring force may be generated in a direction to press the inner wall of the penetration space.

A length by which the frame portion protrudes below the lower surface of the package portion may be greater at an outer portion closest to an end side of the package portion in a plane parallel to an upper surface of the package portion than at an inner portion farthest from an end side of the package portion in the plane.

A second aspect of the present invention provides a manufacturing method of a semiconductor device. The manufacturing method may include preparing a metal base and a semiconductor chip to be placed above the metal base. The manufacturing method may include forming a package portion which houses the metal base and the semiconductor chip, has a lower surface at which the metal base is exposed, and is provided with a penetration space penetrating an upper surface to the lower surface. The manufacturing method may include inserting a frame portion in the penetration space of the package portion. In inserting the frame portion, the frame portion may be inserted in the penetration space such that a lower end of the frame portion protrudes below the lower surface of the package portion and a lower surface of the metal base.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In this specification, one side in a direction parallel to the height direction of a semiconductor device is referred to as an "upper" side, and the other side is referred to as a "lower" side. One of two principal surfaces of a substrate, layer or another member is referred to as an upper surface, and the other surface is referred to as a lower surface. The "upper" and "lower" directions are not limited to the gravitational directions or directions when the semiconductor device is implemented.

In this specification, technical matters may be described using orthogonal coordinate axes of an X-axis, Y-axis and Z-axis. The orthogonal coordinate axes merely specify the relative position of components, and do not exclusively indicate specific directions. For example, the Z-axis does not exclusively indicate the height direction relative to the ground. Note that the positive Z-axis direction and the negative Z-axis direction are directions opposite to each other. When the Z-axis direction is referred to without specifying its positive and negative, it refers to a direction parallel to the positive Z-axis and the negative Z-axis.

Figure 1:
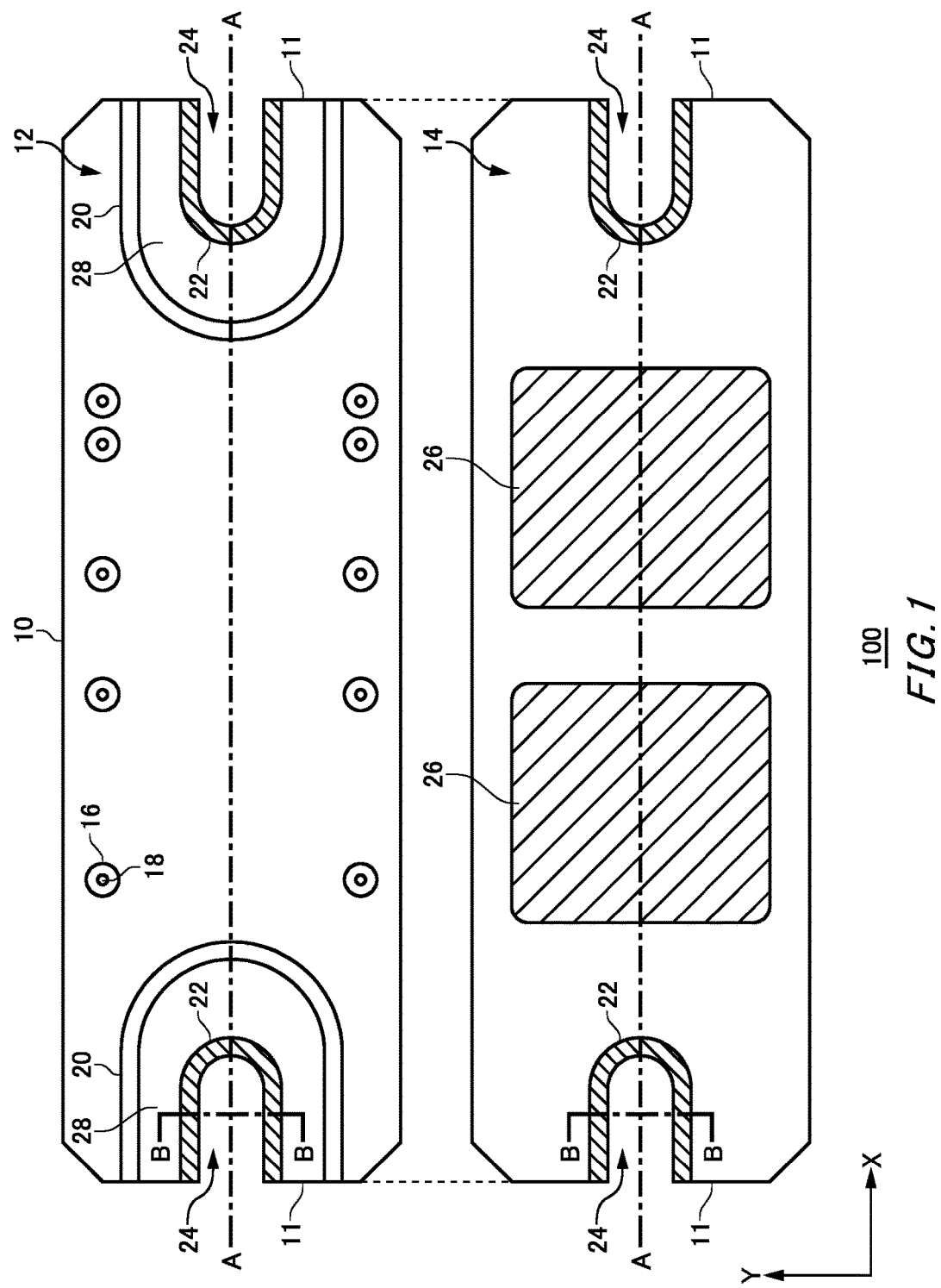
FIG. 1 shows an upper surface 12 and a lower surface 14 of a semiconductor device 100 according to one embodiment of the present invention.

FIG. 1 shows an upper surface 12 and a lower surface 14 of a semiconductor device 100 according to one embodiment of the present invention. The semiconductor device 100 is, for example, a semiconductor module for electric power conversion. The semiconductor device 100 can be used in inverter devices, uninterruptible power supply devices, power conditioners, vehicles such as railway vehicles, machine tools, industrial robots and the like, but the usage of the semiconductor device 100 is not limited to the above.

The semiconductor device 100 includes a package portion 10. The package portion 10 is formed of an insulating material such as resin. The package portion 10 has an upper surface 12 and a lower surface 14. The upper surface 12 and the lower surface 14 refer to two principal surfaces that are among the surfaces of the package portion 10 and have greater areas than the other surfaces. The upper surface 12 and the lower surface 14 in the present example have a longitudinal direction and a lateral direction.

The longitudinal direction of the upper surface 12 and the lower surface 14 refers to a direction parallel to a side having the greatest length of the sides along the outline of the upper surface 12 and the lower surface 14, and the lateral direction refers to a direction perpendicular to the longitudinal direction. In the example of FIG. 1, the longitudinal direction is the X-axis direction, and the lateral direction is the Y-axis direction. Also, in the figures that follow, the height direction perpendicular to both the X-axis and the Y-axis is the Z-axis direction.

The package portion 10 houses one or more semiconductor chips. Also, the package portion 10 houses a metal base 26 that supports a semiconductor chip. The metal base 26 is formed of a metal material such as copper. The metal base 26 may be plate-shaped and have principal surfaces parallel to the X-Y plane. The metal base 26 is exposed at the lower surface 14 of the package portion 10.

A plurality of outer connection pins 18 to be electrically connected to the semiconductor chips are arranged on the upper surface 12 of the package portion 10. An outer connection pin 18 has a lower end provided inside the package portion 10, and is electrically connected to a semiconductor chip. The upper end of the outer connection pin 18 is exposed at the upper surface 12 of the package portion 10, and is electrically connected to an external circuit. The upper surface 12 of the package portion 10 may be provided with a supporting portion 16 which is formed along the outer perimeter of an outer connection pin 18 and supports the outer connection pin 18. The supporting portion 16 may be formed of the same material as the package portion 10.

One or more penetration spaces 24 are provided in the package portion 10. The package portion 10 in the present example has a penetration space 24 at each of two ends in the longitudinal direction. The penetration space 24 is a space penetrating the package portion 10 from the upper surface 12 to the lower surface 14. In the X-Y plane, the penetration space 24 may be a closed space surrounded by the package portion 10, or may be an open space which is partially not surrounded by the package portion 10 as shown in FIG. 1.

For example, the penetration space 24 is an open space provided extending from the end side of the package portion 10 toward the inside of the package portion 10 in the X-Y plane. The open space refers to a space continuous with the space outside the package portion 10 in the X-Y plane.

The penetration space 24 may be a space of which the cross section parallel to the X-Y plane has a constant area from the upper surface 12 side to the lower surface 14 side of the package portion 10, or may have a tapered shape with varying cross-sectional areas. The cross-sectional area of the penetration space 24 in the upper surface 12 may be greater or smaller than its cross-sectional area in the lower surface 14.

The semiconductor device 100 further includes a frame portion 22 provided to surround each penetration space 24. In the X-Y plane, the frame portion 22 may be a closed frame provided along the entire outer perimeter of the penetration space 24, or may be an open frame not provided at part of the outer perimeter of the penetration space 24. The frame portion 22 in the present example is not provided at the portion of the outer perimeter of the penetration space 24 in the X-Y plane, portion which is on the extension of an end side 11 of the package portion 10. That is, the region surrounded by the frame portion 22 in the X-Y plane is continuous with the space outside the package portion 10 at the portion on the extension of the end side 11 of the package portion 10.

The frame portion 22 is formed of a material having a higher hardness than the package portion 10. The frame portion 22 may be formed of metal such as copper or aluminum. The frame portion 22 may be arranged along the wall of the package portion 10 exposed to the penetration space 24. The frame portion 22 may be arranged from the upper surface 12 to the lower surface 14 of the package portion 10.

The penetration space 24 and the frame portion 22 may be arranged at a recessed portion 28 provided in the upper surface 12 of the package portion 10. In the upper surface 12 of the package portion 10, the recessed portion 28 has a shape recessed in a direction toward the lower surface 14. The distance between the upper surface 12 and the lower surface 14 at the recessed portion 28 is shorter than the distance between the upper surface 12 and the lower surface 14 at the other regions. That is, the penetration space 24 and the frame portion 22 may be provided at a region of the package portion 10 having a smaller thickness than the other regions. In this specification, the surface of the package portion 10 observed as seen from above is referred to as an upper surface 12. The upper surface 12 may include surfaces having different heights in the Z-axis direction.

The package portion 10 may have a protruding portion 20. The protruding portion 20 is provided to surround the penetration space 24 and the frame portion 22 on the upper surface 12 of the package portion 10 and to protrude above the upper surface 12. It is preferable that the outer connection pin 18 is not arranged in the region surrounded by the protruding portion 20. Providing the protruding portion 20 makes it possible to increase the creepage distance between the outer connection pin 18 and each of a fastening member such as a screw inserted in the penetration space 24 and the frame portion 22.

Figure 2:
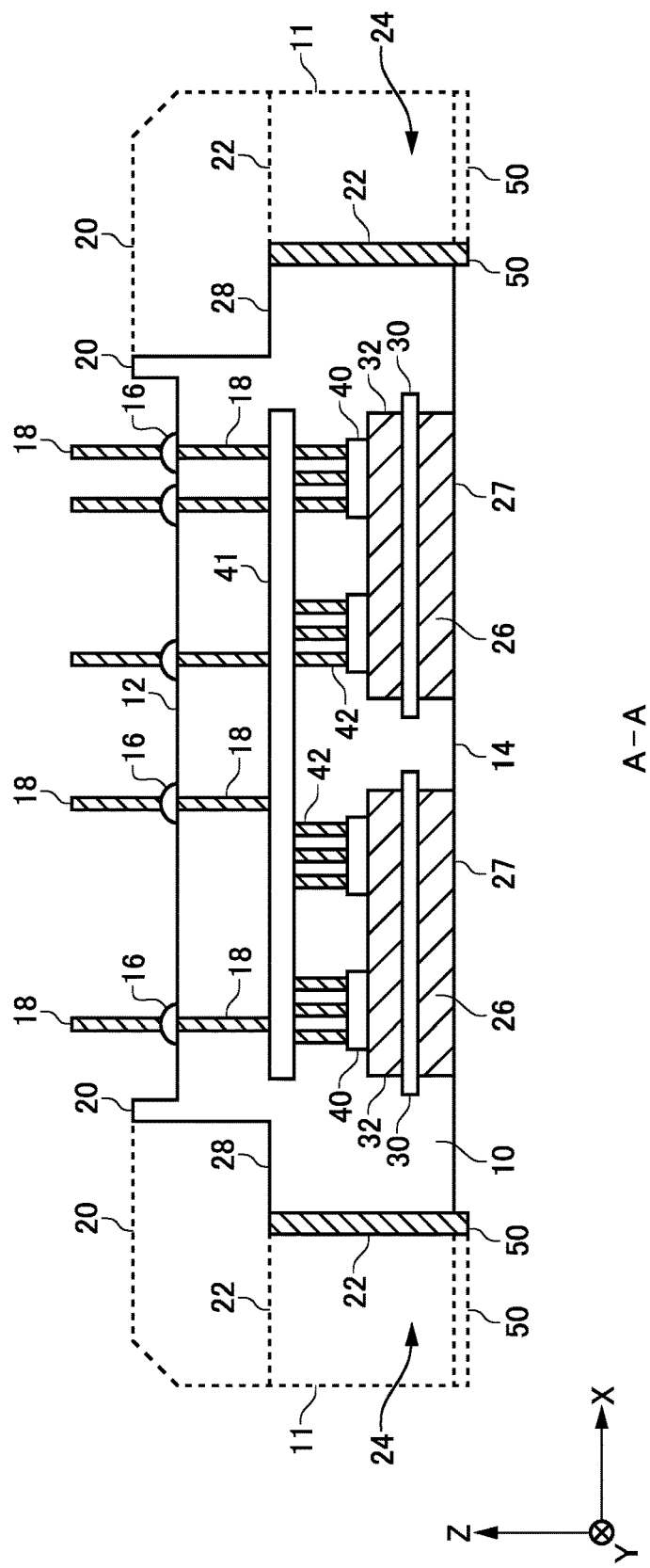
FIG. 2 shows an example of a cross section taken along A-A shown in FIG. 1.

FIG. 2 shows an example of a cross section taken along A-A shown in FIG. 1. The cross section taken along A-A is an X-Z plane passing through the penetration space 24. Note that, in FIG. 2, some members not arranged in the cross section taken along A-A (the outer connection pin 18 and the supporting portion 16, for example) are shown as their projection onto the cross section taken along A-A.

The semiconductor device 100 is equipped with one or more semiconductor chips 40. The semiconductor device 100 shown in FIG. 2 is equipped with a plurality of semiconductor chips 40. The semiconductor device 100 may be equipped with an upper arm portion and a lower arm portion of an inverter circuit. A plurality of semiconductor chips 40 may be included in each arm portion. The semiconductor chip 40 includes a power semiconductor switching element such as a MOSFET and an insulated gate bipolar transistor (IGBT).

The semiconductor element included in the semiconductor chip 40 may be formed of semiconductor such as silicon, or may be formed of compound semiconductor having a wide band gap such as silicon carbide and gallium nitride. The semiconductor element may be a SiC-MOSFET, SiC-JFET, GaN-HEMT or the like.

Each semiconductor chip 40 is housed in the package portion 10 formed of an insulating material such as resin. The package portion 10 seals the semiconductor chip 40 such that the semiconductor chip 40 is not exposed.

The semiconductor chip 40 in the present example is arranged on a plate-shaped first metal base 32 formed of a conductive material such as copper. The first metal base 32 may be electrically connected to any terminal of the semiconductor chip 40. The first metal base 32 in the present example is connected to a main terminal of the semiconductor chip 40. The main terminal refers to, for example, a terminal connected to the source or drain of a MOSFET.

The first metal base 32 is arranged on a plate-shaped second metal base 26 with an insulating substrate 30 of ceramic or the like interposed therebetween. The first metal base 32, the insulating substrate 30 and the second metal base 26 are housed in the package portion 10. Note that a lower surface 27 of the second metal base 26 is exposed at the lower surface 14 of the package portion 10. The lower surface 27 of the second metal base 26 may be arranged to be flush with the lower surface 14 of the package portion 10, or may protrude below the lower surface 14.

In the example of FIG. 2, an example has been described where the insulating substrate 30 is provided between two metal bases, but the structure of the metal base is not limited by the example of FIG. 2. It may be only required that the semiconductor chip 40 is placed above the metal base 26 exposed at the lower surface 14 of the package portion 10, and the semiconductor chip 40 and the metal base 26 are thermally connected by metal, ceramic or the like having a higher thermal conductivity than resin.

The semiconductor device 100 in the present example includes an interconnection substrate 41 which is housed in the package portion 10 and is arranged to face the semiconductor chip 40. The interconnection substrate 41 is, for example, a printed circuit board. In the interconnection substrate 41, wiring is formed to electrically connect a circuit provided external to the semiconductor device 100 and a terminal of the semiconductor chip 40. In the present example, the interconnection substrate 41 and each semiconductor chip 40 are electrically connected by one or more internal connection pins 42. Also, the lower end of the outer connection pin 18 is connected to the interconnection substrate 41. The interconnection substrate 41 may be connected to the first metal base 32 by the outer connection pin 18 or the like.

The penetration space 24 and the frame portion 22 are arranged closer to the end side 11 of the package portion 10 than the second metal base 26 and the semiconductor chip 40. A lower end 50 of the frame portion 22 protrudes below (beyond in the negative Z-axis direction) both the lower surface 27 of the second metal base 26 and the lower surface 14 of the package portion 10. As the lower end 50 of the frame portion 22 protrudes below them, when the lower surface 27 of the second metal base 26 is connected to an external device such as a heat-dissipation fin set, a space having a certain thickness can be provided between the lower surface 27 and the external device. By providing thermal grease or the like in the space, variation in the thickness of the thermal grease or the like can be reduced, and variation in the efficiency of heat-dissipation or the like can be reduced.

Figure 3:
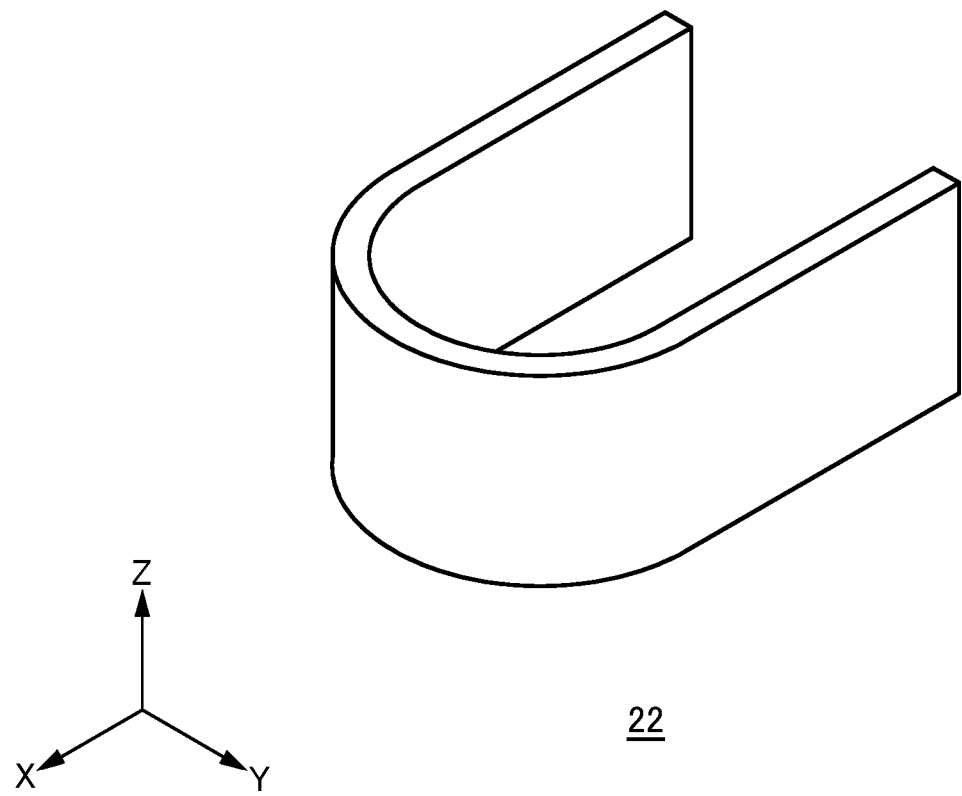
FIG. 3 is a perspective view showing an example of the shape of a frame portion 22.

FIG. 3 is a perspective view showing an example of the shape of the frame portion 22. The frame portion 22 has a shape along the inner wall of the penetration space 24 in the X-Y plane. The frame portion 22 in the present example has a U-shape in the X-Y plane. The frame portion 22 in the present example is formed continuously along the Z-axis. In the present example, the shape of the frame portion 22 in the X-Y cross section is the same at any position along the Z-axis.

Figure 4:
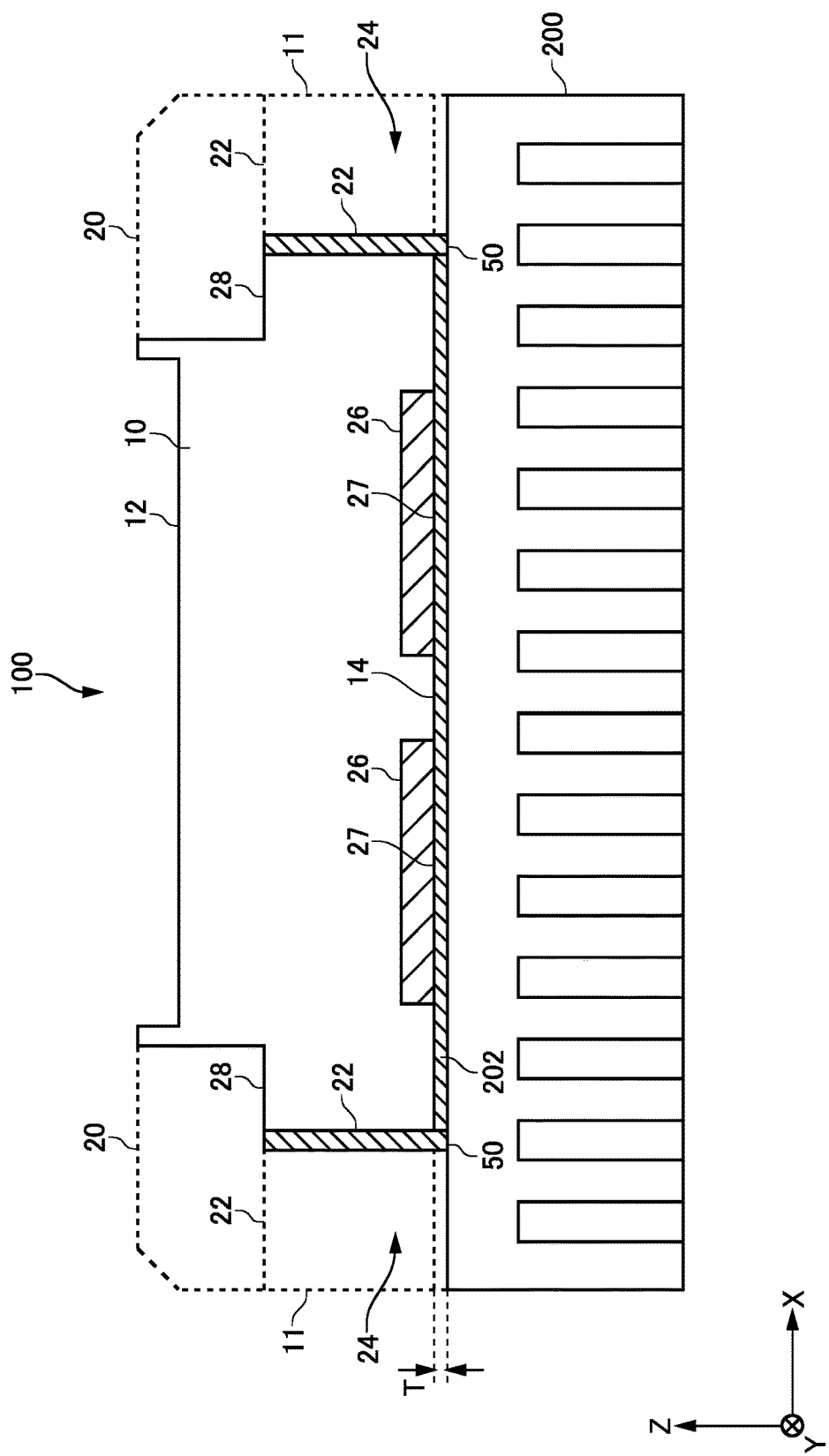
FIG. 4 is a cross-sectional view showing an example where the semiconductor device 100 is placed on a heat-dissipation fin set 200.

FIG. 4 is a schematic view showing an example where the semiconductor device 100 is placed on a heat-dissipation fin set 200. FIG. 4 shows the same cross section as the cross section shown in FIG. 2, but members provided in the package portion 10 other than the frame portion 22 and the metal base 26 are omitted. The heat-dissipation fin set 200 is an example of a heat-dissipation portion. The heat-dissipation fin set 200 may be included as a component of the semiconductor device 100. The lower end 50 of the frame portion 22 contacts the upper surface of the heat-dissipation fin set 200.

The lower end 50 of the frame portion 22 protrudes below the lower surface 27 of the metal base 26, and therefore a space having a predetermined thickness T is provided between the lower surface 27 of the metal base 26 and the heat-dissipation fin set 200. Also, a space is provided between the lower surface of the package portion 10 and the heat-dissipation fin set 200. These spaces are filled with thermal grease 202. The thickness T of the space is approximately equal to the length by which the lower end 50 of the frame portion 22 protrudes below the lower end of the metal base 26. Such a structure can reduce variation in the thickness T of the thermal grease 202. Thus, variation in thermal conduction between the metal base 26 and the heat-dissipation fin set 200 can be reduced.

The length by which the lower end 50 of the frame portion 22 protrudes below the lower end of the metal base 26 (that is, the thickness T) may be 50 µm or more and 100 µm or less. If the thickness T is excessively large, the thermal conduction property between the metal base 26 and the heat-dissipation fin set 200 is lowered. Also, if the thickness T is excessively small, it is difficult to fill the space between the metal base 26 and the heat-dissipation fin set 200 with the thermal grease 202. The thickness T may be 60 µm or more, or may be 70 µm or more. The thickness T may be 90 µm or less, or may be 80 µm or less.

Figure 5:
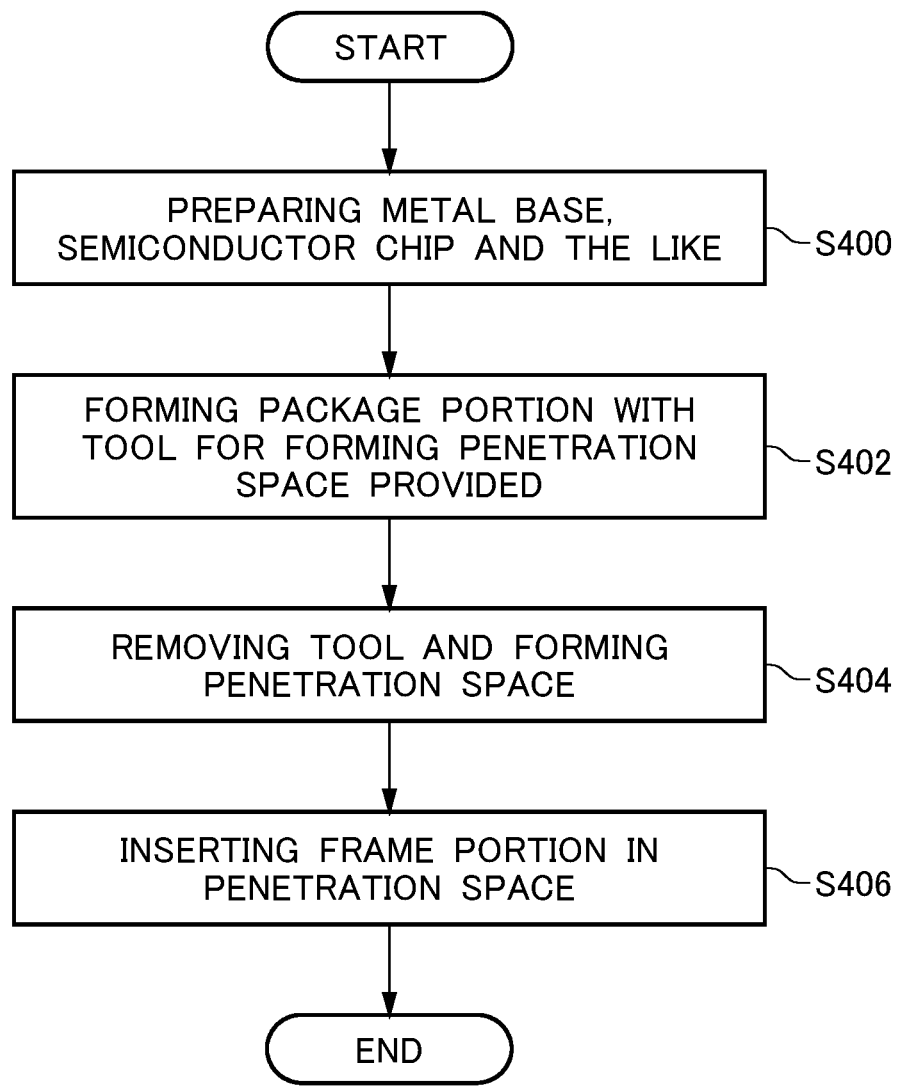
FIG. 5 is a flowchart illustrating some processes in a manufacturing method of the semiconductor device 100.

FIG. 5 is a flowchart illustrating some processes in a manufacturing method of the semiconductor device 100. First, in Step S400, members to be housed in the package portion 10 such as the metal base 26 and the semiconductor chip 40 are prepared.

In Step S402, members such as the metal base 26 and the semiconductor chip 40 are arranged at a predetermined position relative to a mold for injection molding of the package portion 10. Also, a tool for forming the penetration space 24 is arranged at a position where the penetration space 24 is to be formed. The outline of at least part of the tool is the same as the shape of the penetration space 24. The tool may be formed of metal such as copper. With these members and the tool arranged, resin is injected into the mold. After injecting resin, irradiation of an ultraviolet ray or the like may be performed to cure the resin. In this manner, the package portion 10 is formed.

In Step S404, the tool for forming the penetration space 24 is removed from the package portion 10. For example, the tool is taken out from the package portion 10 by pushing out or drawing out the tool. In this manner, the penetration space 24 is formed in the package portion 10.

In Step S406, the frame portion 22 is inserted in the penetration space 24. At this time, the frame portion 22 is inserted such that the lower end 50 of the frame portion 22 protrudes below the lower surface 27 of the metal base 26 and the lower surface 14 of the package portion 10. In Step S406, a receiving tool with a concave portion having a depth corresponding to the amount by which the frame portion 22 protrudes may be arranged on the lower surface 14 side of the package portion 10, and then the frame portion 22 may be inserted in the penetration space 24 from the upper surface side of the package portion 10.

The outline of the frame portion 22 may be the same as the shape of the penetration space 24, as shown in FIG. 1 to FIG. 3. Also, the frame portion 22 has springiness, and the outline of the frame portion 22 may become the same as the shape of the penetration space 24 when the frame portion 22 is inserted in the penetration space 24.

The semiconductor device 100 can be manufactured by such processes. Since the frame portion 22 is inserted in the penetration space 24 after the package portion 10 is formed, the resin does not remain in the penetration space 24 inside the frame portion 22. Thus, a process of removing the resin from the inside of the frame portion 22 can be omitted, and generation of flaws in the inner surface of the frame portion 22 when removing the resin can be suppressed.

Also, since the frame portion 22 is inserted after the package portion 10 is formed, it is easy to allow the lower end 50 of the frame portion 22 to protrude from the lower surface 27 of the metal base 26 and the lower surface 14 of the package portion 10, and the length by which it protrudes can be easily adjusted. Also, it is easy to allow the upper end of the frame portion 22 to protrude from the upper surface 12 of the package portion 10.

Figure 6:
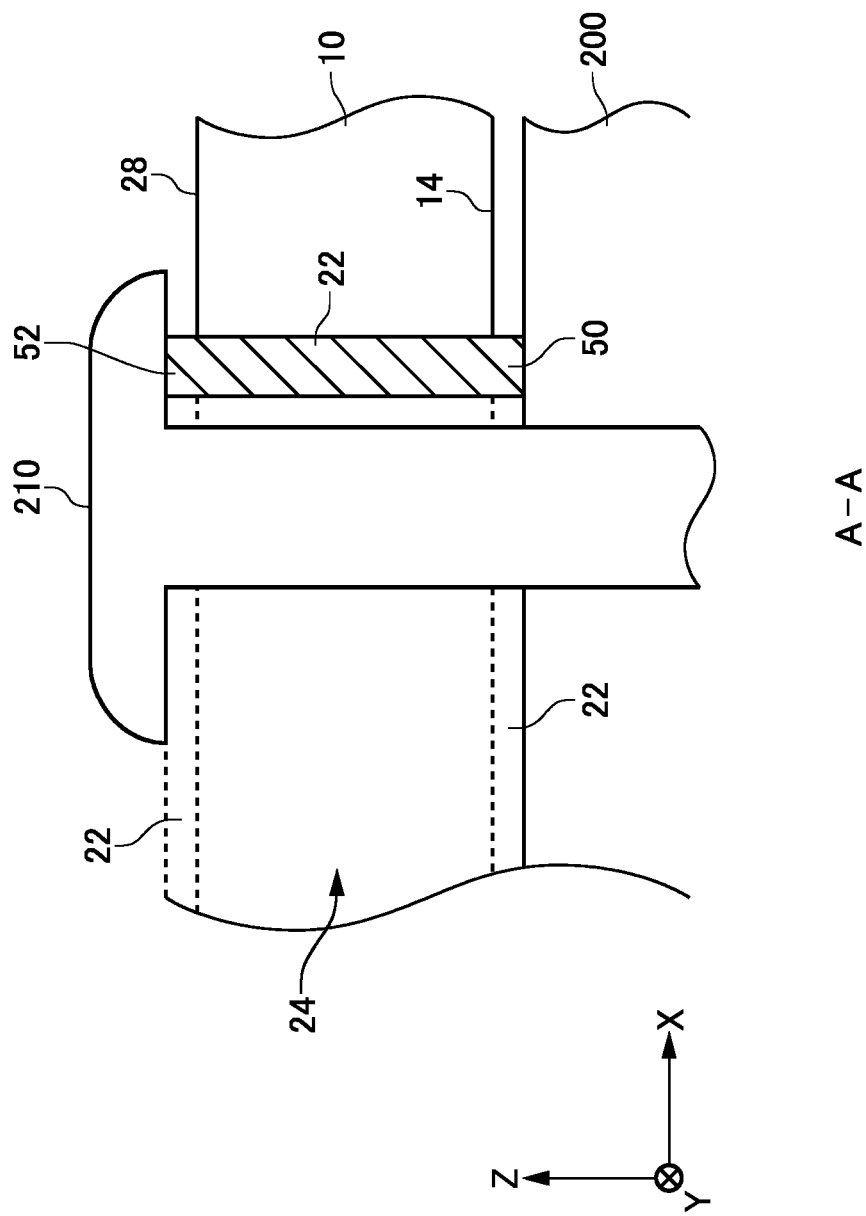
FIG. 6 is an enlarged view of the vicinity of the frame portion 22 in the cross section taken along A-A.

FIG. 6 is an enlarged view of the vicinity of the frame portion 22 in the cross section taken along A-A. In FIG. 6, for the frame portion 22, only its cross section that is in the cross section taken along A-A is shown. In FIG. 6, a fastening member 210 inserted in the penetration space 24 surrounded by the frame portion 22 is also shown. The fastening member 210 is, for example, a screw.

In the present example, the lower end 50 of the frame portion 22 protrudes below the lower surface 14 of the package portion 10, and the upper end 52 of the frame portion 22 protrudes above the upper surface 12 of the package portion 10 (the bottom surface of the recessed portion 28 in the example of FIG. 6). The length by which the lower end 50 protrudes from the lower surface 14 and the length by which the upper end 52 protrudes from the upper surface 12 (the bottom surface of the recessed portion 28 in the present example) may be the same, or may be different.

The upper end 52 of the frame portion 22 contacts the fastening member 210. In this manner, the fastening member 210 does not contact the upper surface 12 of the package portion 10 (the bottom surface of the recessed portion 28 in the present example). Also, the lower end 50 of the frame portion 22 contacts an external device such as the heat-dissipation fin set 200. The lower end of the fastening member 210 is inserted into a screw hole or the like provided in an external device such as the heat-dissipation fin set 200. Thus, when the fastening member 210 is tightened, force to compress in the Z-axis direction may be applied to the frame portion 22, but such compression force is not applied to the package portion 10. Thus, the package portion 10 can be protected.

Figure 7:
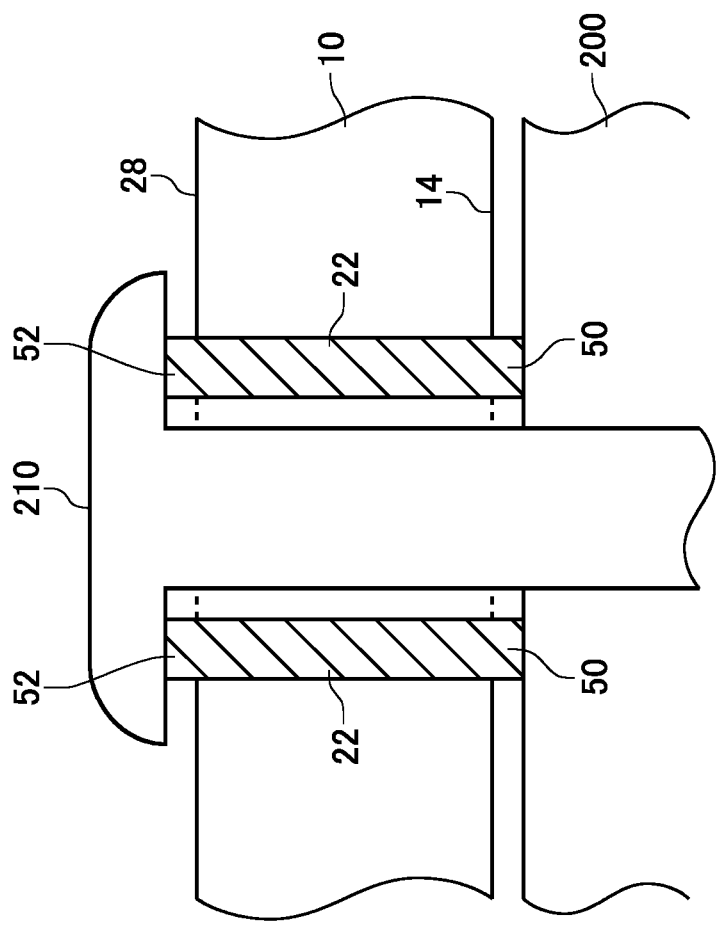
FIG. 7 is an enlarged view of the vicinity of the frame portion 22 in a cross section taken along B-B in FIG. 1.

FIG. 7 is an enlarged view of the vicinity of the frame portion 22 in a cross section taken along B-B in FIG. 1. The cross section taken along B-B is a cross section that is perpendicular to the cross section taken along A-A and is parallel to the Y-Z plane. As shown in FIG. 7, in the cross section taken along B-B, frame portions 22 are arranged on both sides of the fastening member 210, and the upper end of each frame portion 22 contacts the fastening member 210.

Figure 8:
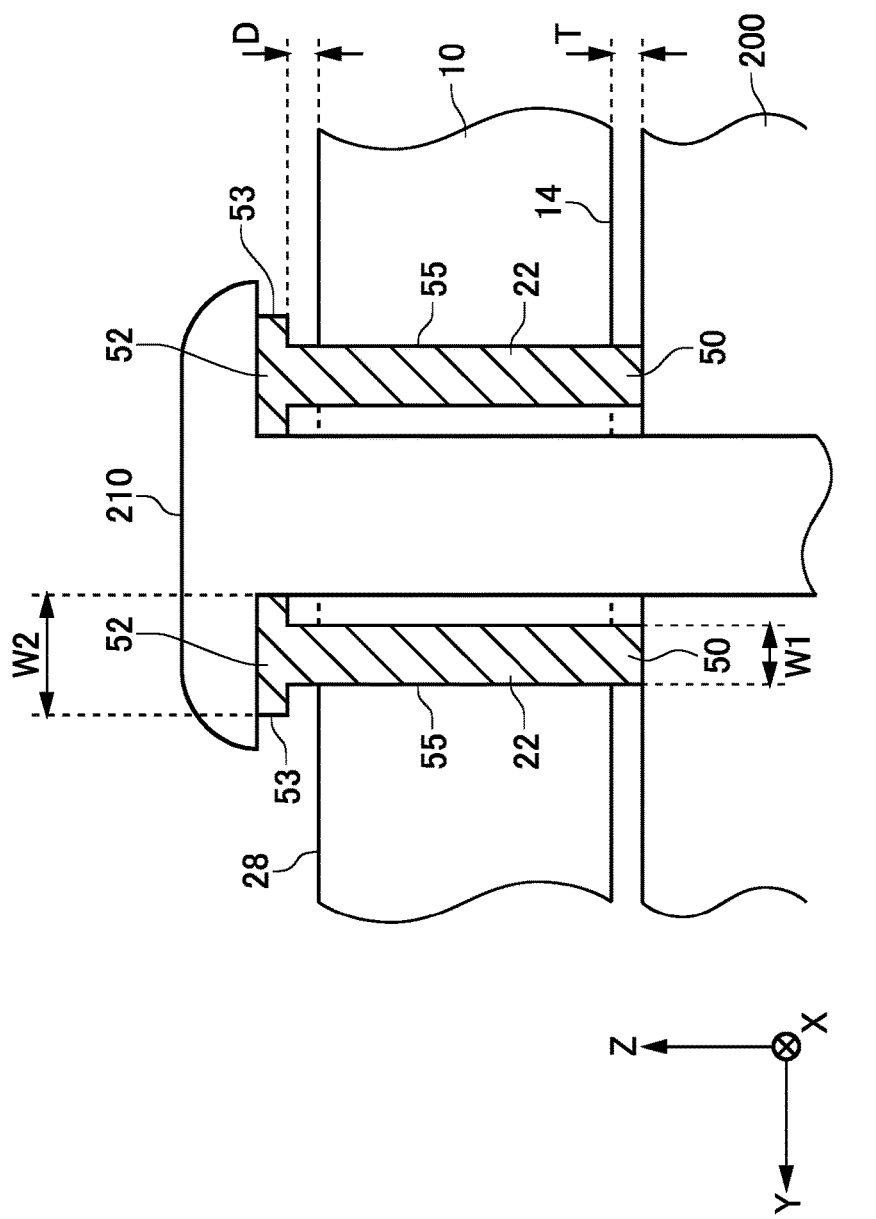
FIG. 8 shows another example of the frame portion 22 in the cross section taken along B-B.

FIG. 8 shows another example of the frame portion 22 in the cross section taken along B-B. The frame portion 22 in the present example has a wider portion 53. A width W2 of the wider portion 53 outside the package portion 10 is greater than a width W1 of a portion 55 inserted in the penetration space 24 of the package portion 10. The widths refer to widths in at least one direction in the X-Y plane. In the present example, the width W2 of the wider portion 53 is greater than the width W1 of the portion 55 in the Y-axis direction in the cross section taken along B-B.

The wider portion 53 in the present example is arranged above the upper surface 12 of the package portion 10 (the bottom surface of the recessed portion 28 in FIG. 8). The wider portion 53 may be arranged at the upper end 52 of the frame portion 22. The upper surface of the wider portion 53 contacts the fastening member 210. It is preferable that the lower surface of the wider portion 53 does not contact the upper surface of the package portion 10 (the bottom surface of the recessed portion 28 in the present example). In this manner, the package portion 10 can be protected while preventing the frame portion 22 from falling out of the penetration space 24.

Figure 9:
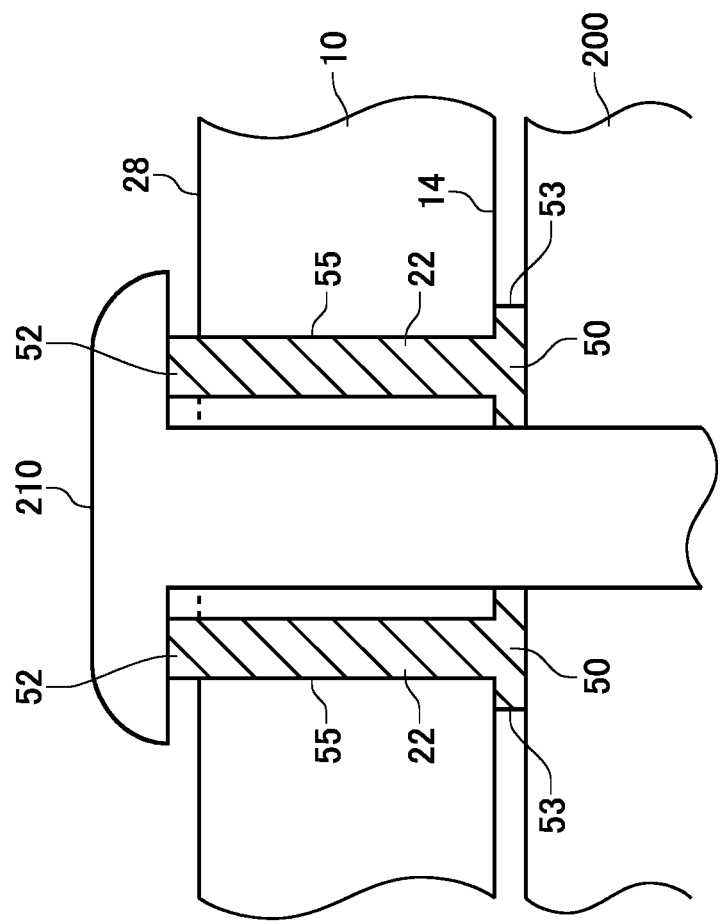
FIG. 9 shows another example of the frame portion 22 in the cross section taken along B-B.

FIG. 9 shows another example of the frame portion 22 in the cross section taken along B-B. The frame portion 22 in the present example has a wider portion 53 at the lower end 50. It is preferable that the wider portion 53 is formed along the lower surface of the package portion 10. That is, the upper surface of the wider portion 53 contacts the lower surface of the package portion 10. It is preferable that the thickness of the wider portion 53 is the same as the length by which the lower end 50 of the frame portion 22 protrudes below the lower surface of the package portion 10.

Such a structure allows the thickness of the space between the semiconductor device 100 and an external device such as the heat-dissipation fin set 200 to be controlled more precisely. Also, the area in which the frame portion 22 contacts an external device such as the heat-dissipation fin set 200 can be increased, and therefore the stress applied to the external device can be dispersed. The width W2 of the wider portion 53 shown in FIG. 8 or FIG. 9 may be 1.5 times or more, or two times or more of the width W1 of the portion 55.

Figure 10:
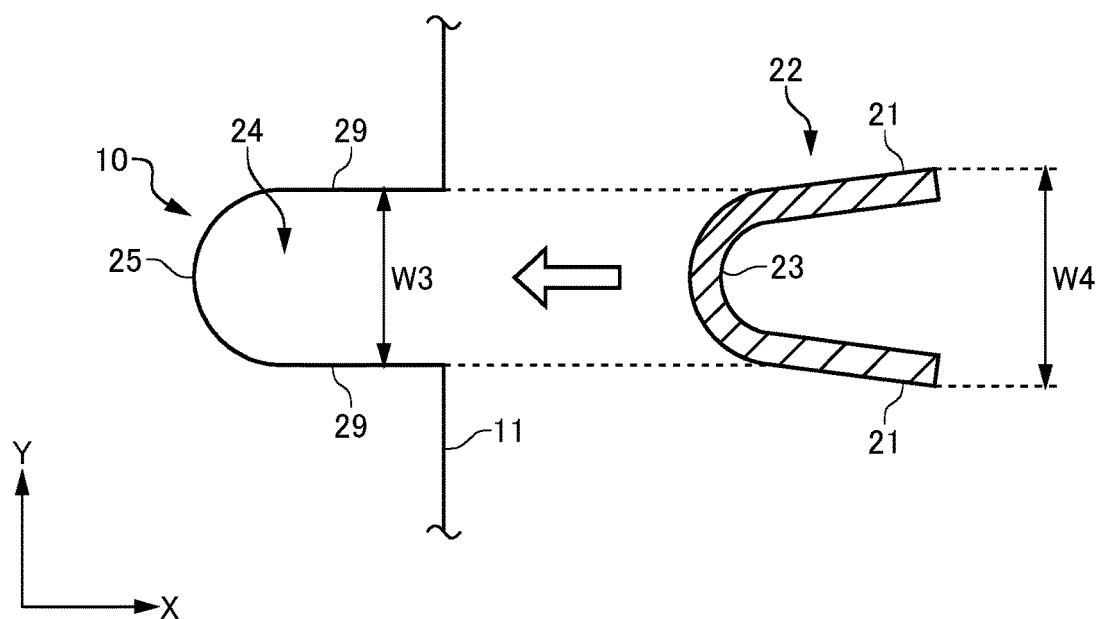
FIG. 10 shows an example of the shapes of the frame portion 22 and a penetration space 24 in the X-Y plane.

FIG. 10 shows an example of the shapes of the frame portion 22 and the penetration space 24 in the X-Y plane. As described above, the penetration space 24 in the present example is a U-shaped open space provided extending from the end side 11 of the package portion 10 toward the inside of the package portion 10 in the X-Y plane.

In the X-Y plane, the penetration space 24 may have a curved shape at a tip portion 25 farthest from the end side 11 of the package portion 10. In the X-Y plane, the penetration space 24 has two connection portions 29 that connect the tip portion 25 and the end side 11. The connection portions 29 may be provided in parallel and in a linear shape in the X-Y plane. The distance between the two connection portions 29 is referred to as W3.

The frame portion 22 has a tip portion 23 and two connection portions 21. The tip portion 23 of the frame portion 22 has a curved shape similar to the tip portion 25 of the penetration space 24. The connection portions 21 are provided extending from both respective ends of the tip portion 23 in the X-axis direction. The two connection portions 21 may be provided in parallel, or may not be provided in parallel, in the X-Y plane.

The frame portion 22 in the present example has springiness. That is, the frame portion 22 elastically deforms in response to applied force, and generates restoring force so as to be restored to its original shape. It is preferable that, when the frame portion 22 is inserted along the inner wall of the penetration space 24, restoring force is generated in a direction to press the inner wall of the penetration space 24. In this manner, the frame portion 22 falling out of the penetration space 24 can be suppressed.

In the present example, when the frame portion 22 is not inserted in the penetration space 24 (that is, when force is not applied thereto), a width W4 between the ends of the two connection portions 21 opposite to the tip portion 23 is greater than the width W3 between the two connection portions 29 of the penetration space 24. The width between the portions of the two connection portions 21 connected to the tip portion 23 may be the same as the width W3 between the connection portions 29. As shown in FIG. 10, when the frame portion 22 is not inserted in the penetration space 24, it has a shape in which the width between the two connection portions 21 increases as the distance from the tip portion 23 increases.

When the frame portion 22 having such a structure is inserted in the penetration space 24, the two connection portions 21 are pressed so as to approach each other. In this manner, restoring force is generated such that the connection portions 21 of the frame portion 22 press the connection portions 29 of the penetration space 24 toward the outside.

Figure 11A:
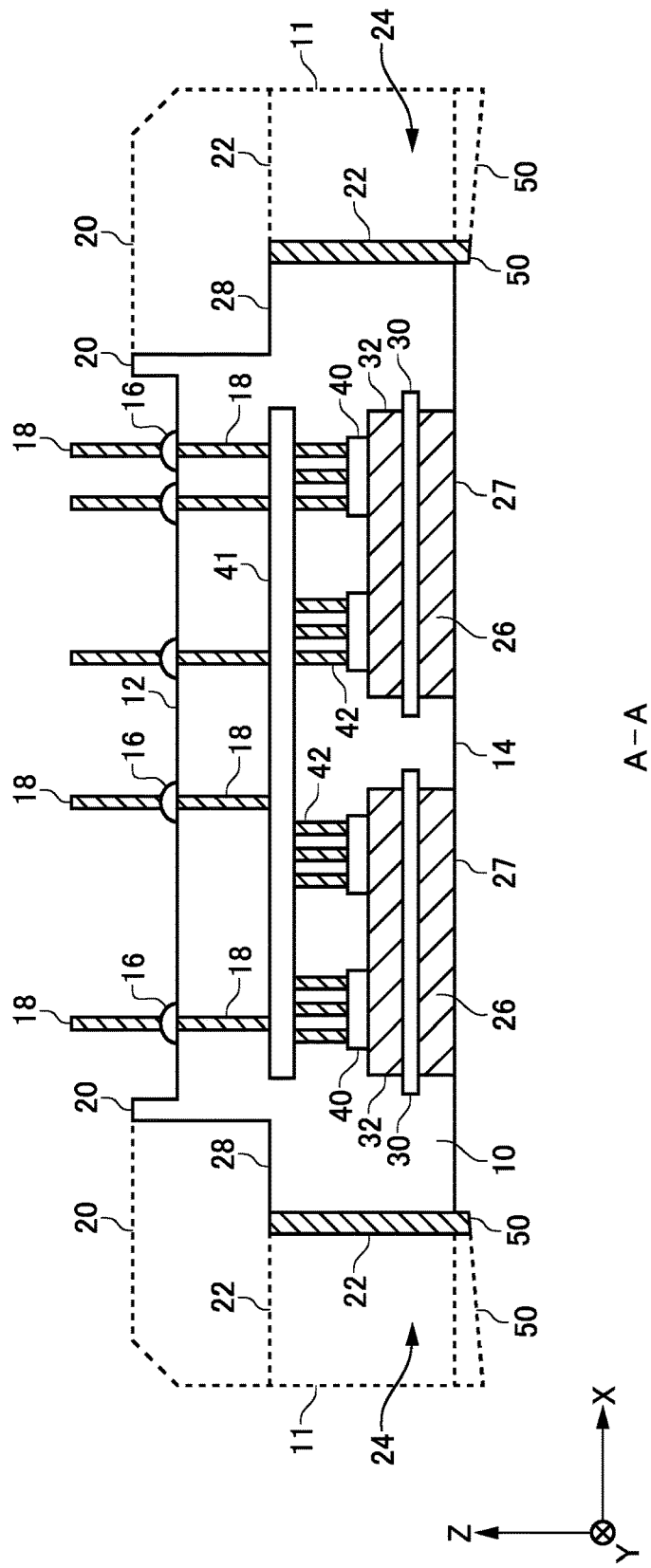
FIG. 11A shows another example of the shape of a lower end 50 of the frame portion 22.

FIG. 11A shows another example of the shape of the lower end 50 of the frame portion 22. Structures other than the shape of the lower end 50 of the frame portion 22 are the same as those of the semiconductor device 100 in any form described in FIG. 1 to FIG. 10. In FIG. 11A, an example is shown where the shape of the lower end 50 of the frame portion 22 is altered from that in the structure shown in FIG. 2. In the present example, the lower end 50 of the frame portion 22 has a shape tilted in the X-Z plane, as shown in FIG. 11A.

Figure 11B:
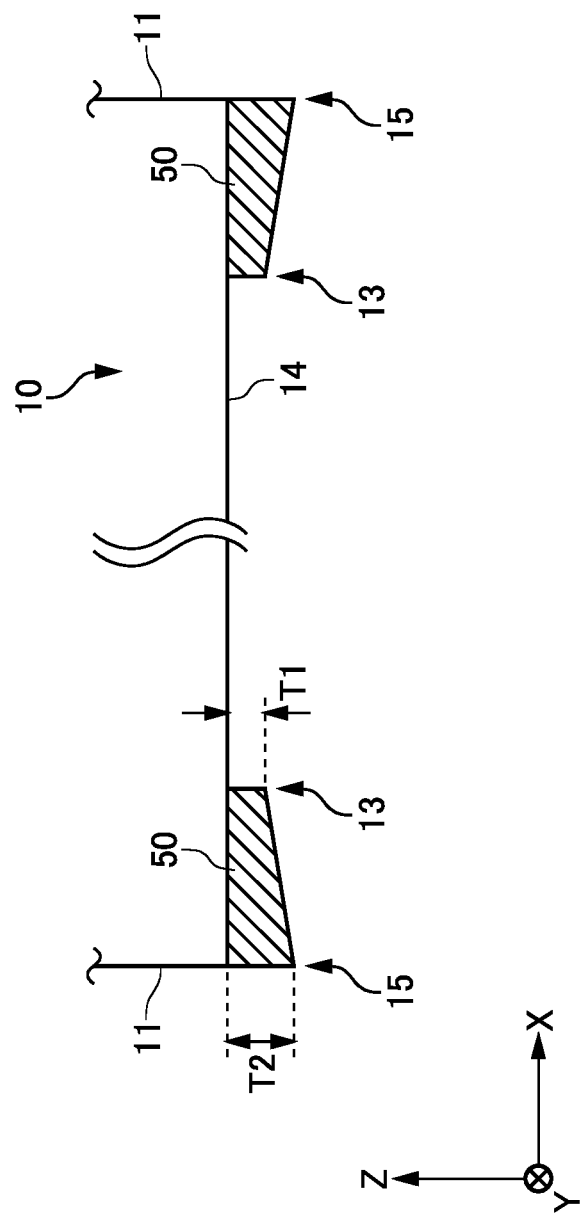
FIG. 11B is an enlarged view of the vicinity of the lower end 50 of the frame portion 22.

FIG. 11B is an enlarged view of the vicinity of the lower end 50 of the frame portion 22 shown in FIG. 11A. Note that, in FIG. 11B, the tip portion 23 and the connection portions 21 of the frame portion 22 shown in FIG. 10 are both shown as their projection onto the same X-Z plane. In the present example, the length by which the frame portion 22 protrudes below the lower surface 14 of the package portion 10 is greater at an outer portion 15 closest to the end side 11 of the package portion 10 (that is, the end of the connection portion 21 opposite to the tip portion 23) in the X-Y plane than at an inner portion 13 farthest from the end side 11 of the package portion 10 (that is, the tip portion 23) in the X-Y plane. In the present example, when the length by which the inner portion 13 protrudes is referred to as T1 and the length by which the outer portion 15 protrudes is referred to as T2, T2 is greater than T1. Note that, in the X-Z plane, the lower end 50 between the inner portion 13 and the outer portion 15 has a linear shape, but the lower end 50 may have a curved shape. The length by which the lower end 50 protrudes may increase toward the outer portion 15 from the inner portion 13.

In some cases, warping is generated in the semiconductor device 100 due to temperature change. In particular, relatively large warping may be generated in the longitudinal direction of the semiconductor device 100 (the X-axis direction in the present example). When warping is generated in the semiconductor device 100, both ends of the package portion 10 are displaced in the upper direction. As the lower end 50 of the frame portion 22 has a tilted shape, warping in the semiconductor device 100 can be canceled.

Figure 12:
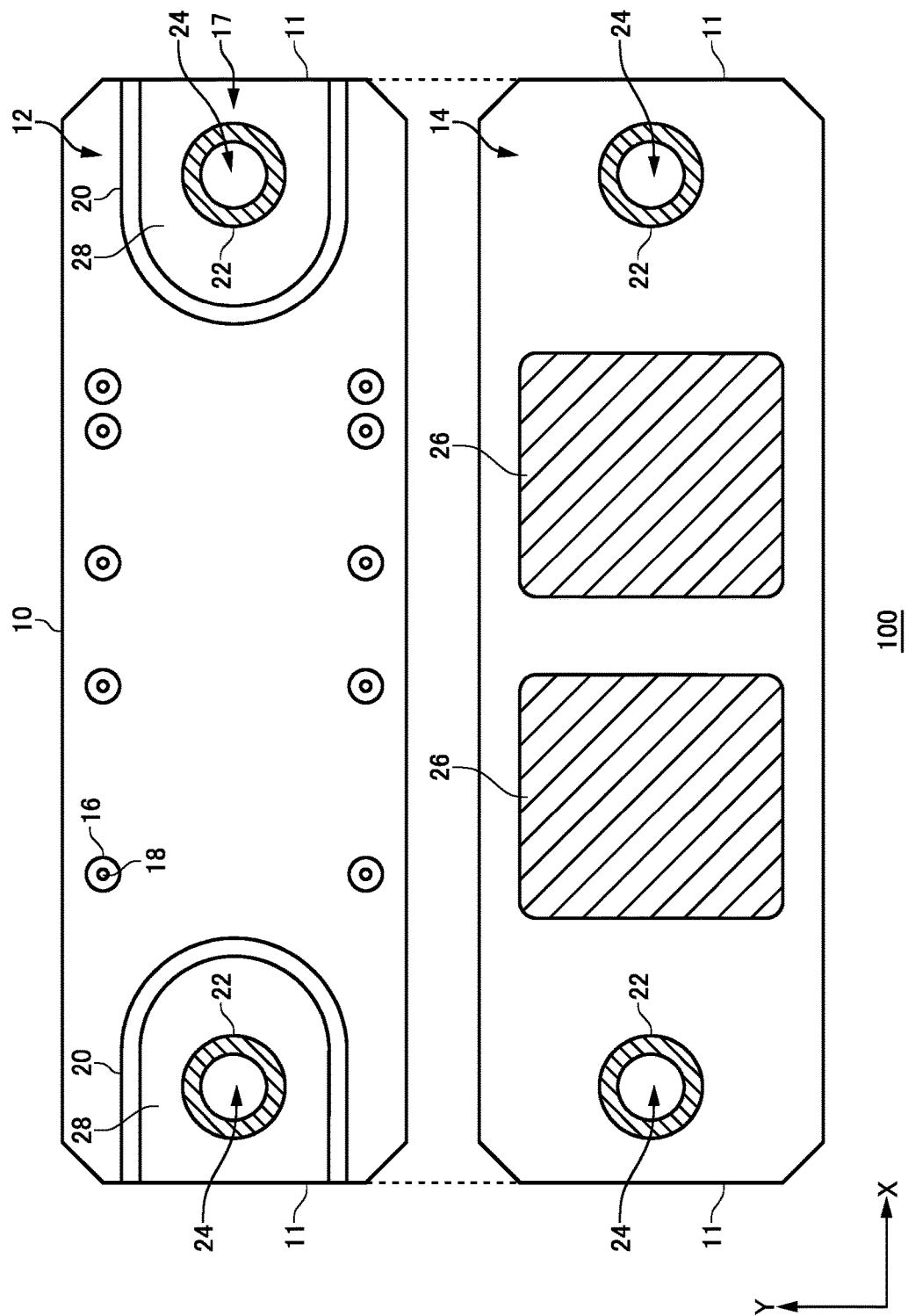
FIG. 12 shows another example of the semiconductor device 100.

FIG. 12 shows another example of the semiconductor device 100. According to the semiconductor device 100 in the present example, the shapes of the penetration space 24 and the frame portion 22 are different from those of the examples in the FIG. 1 to FIG. 11B. Other structures are the same as those of the semiconductor device 100 in any aspect described in FIG. 1 to FIG. 11B.

The penetration space 24 in the present example is a closed space that is not continuous with the space outside the package portion 10 in the X-Y plane. Note that, in the Z-axis direction, the penetration space 24 is continuous with the space outside the package portion 10. For example, the shape of the penetration space 24 in the X-Y plane is a circle, but the shape of the penetration space 24 is not so limited.

The frame portion 22 is provided along the inner wall of the package portion 10 exposed to the penetration space 24. In the X-Y plane, the outline of the frame portion 22 is the same as the outline of the penetration space 24. For example, the shape of the frame portion 22 in the X-Y plane is circular, but the shape of the frame portion 22 is not so limited.

In the present example as well, the lower end 50 of the frame portion 22 protrudes below the lower surface 27 of the metal base 26 and the lower surface 14 of the package portion 10. In the present example as well, it is possible to reduce variation in the thickness of the space between the semiconductor device 100 and an external device such as the heat-dissipation fin set 200. The upper end 52 of the frame portion 22 may also protrude above the upper surface 12 of the package portion 10.

Note that, if the penetration space 24 and the frame portion 22 have a closed shape, a remaining portion 17 having a relatively small thickness in the X-axis direction is provided between the frame portion 22 and the end side 11 of the package portion 10. Since the remaining portion 17 has a small thickness, its strength is lower than the other portions. In contrast, the semiconductor device 100 in the examples of FIG. 1 to FIG. 11B does not include the remaining portion 17, and therefore the strength of the package portion 10 can be improved.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10: package portion, 11: end side, 12: upper surface, 13: inner portion, 14: lower surface, 15: outer portion, 16: supporting portion, 17: remaining portion, 18: outer connection pin, 20: protruding portion, 21: connection portion, 22: frame portion, 23: tip portion, 24: penetration space, 25: tip portion, 26: metal base, 27: lower surface, 28: recessed portion, 29: connection portion, 30: insulating substrate, 32: metal base, 40: semiconductor chip, 41: interconnection substrate, 42: internal connection pin, 50: lower end, 52: upper end, 53: wider portion, 55: portion, 100: semiconductor device, 200: heat-dissipation fin set, 202: thermal grease, 210: fastening member

What is claimed is:

1. A semiconductor device, comprising:
a package portion;
a metal base which is housed in the package portion and is exposed at a lower surface of the package portion;
a semiconductor chip which is housed in the package portion and is placed above the metal base; and
a frame portion provided to surround a penetration space penetrating the package portion, wherein
a lower end of the frame portion protrudes below the lower surface of the package portion and a lower surface of the metal base, and
the frame portion has a wider portion outside the package portion, the wider portion having a greater width than a portion inserted in the penetration space of the package portion.

2. The semiconductor device according to claim 1, wherein the wider portion is provided above an upper surface of the package portion.

3. The semiconductor device according to claim 1, wherein the wider portion is provided to contact the lower surface of the package portion.

4. The semiconductor device according to claim 1, further comprising a heat-dissipation portion provided below the lower surface of the metal base, wherein
the lower end of the frame portion contacts the heat-dissipation portion.

5. The semiconductor device according to claim 1, further comprising thermal grease provided on the lower surface of the metal base.

6. The semiconductor device according to claim 1, wherein an upper end of the frame portion protrudes above an upper surface of the package portion.

7. A semiconductor device, comprising:
a package portion;
a metal base which is housed in the package portion and is exposed at a lower surface of the package portion;
a semiconductor chip which is housed in the package portion and is placed above the metal base; and
a frame portion provided to surround a penetration space penetrating the package portion, wherein
a lower end of the frame portion protrudes below the lower surface of the package portion and a lower surface of the metal base, and
a length by which the lower end of the frame portion protrudes below the lower surface of the metal base is 50 μm or more and 100 μm or less.

8. A semiconductor device, comprising:
a package portion;
a metal base which is housed in the package portion and is exposed at a lower surface of the package portion;
a semiconductor chip which is housed in the package portion and is placed above the metal base; and
a frame portion provided to surround a penetration space penetrating the package portion, wherein
a lower end of the frame portion protrudes below the lower surface of the package portion and a lower surface of the metal base, and
the penetration space is an open space provided extending from an end side of the package portion toward an inside of the package portion in a plane parallel to an upper surface of the package portion.

9. The semiconductor device according to claim 8, wherein the penetration space has a curved shape at a tip portion farthest from the end side of the package portion in the plane parallel to the upper surface of the package portion.

10. The semiconductor device according to claim 8, wherein the frame portion has springiness, and, when the frame portion is inserted along an inner wall of the penetration space, a restoring force is generated in a direction to press the inner wall of the penetration space.

11. The semiconductor device according to claim 1, wherein a length by which the frame portion protrudes below the lower surface of the package portion is greater at an outer portion closest to an end side of the package portion in a plane parallel to an upper surface of the package portion than at an inner portion farthest from an end side of the package portion in the plane.

* * * * *